United States Patent
Ohba et al.

(10) Patent No.: US 11,522,132 B2
(45) Date of Patent: Dec. 6, 2022

(54) STORAGE DEVICE AND STORAGE UNIT WITH A CHALCOGEN ELEMENT

(71) Applicant: SONY SEMICONDUCTOR SOLUTIONS CORPORATION, Kanagawa (JP)

(72) Inventors: Kazuhiro Ohba, Tokyo (JP); Seiji Nonoguchi, Kanagawa (JP); Hiroaki Sei, Kanagawa (JP); Takeyuki Sone, Kanagawa (JP); Minoru Ikarashi, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 127 days.

(21) Appl. No.: 16/962,875

(22) PCT Filed: Dec. 6, 2018

(86) PCT No.: PCT/JP2018/044965
§ 371 (c)(1),
(2) Date: Jul. 17, 2020

(87) PCT Pub. No.: WO2019/146268
PCT Pub. Date: Aug. 1, 2019

(65) Prior Publication Data
US 2020/0350498 A1    Nov. 5, 2020

(30) Foreign Application Priority Data
Jan. 25, 2018  (JP) .............................. JP2018-010229

(51) Int. Cl.
*H01L 45/00*  (2006.01)
*G11C 11/56*  (2006.01)
(Continued)

(52) U.S. Cl.
CPC ...... *H01L 45/1253* (2013.01); *G11C 11/5678* (2013.01); *G11C 11/5685* (2013.01);
(Continued)

(58) Field of Classification Search
CPC ............. H01L 45/1253; H01L 27/2472; H01L 45/142; H01L 45/143; H01L 45/144;
(Continued)

(56) References Cited

U.S. PATENT DOCUMENTS

2013/0256622 A1* 10/2013 Sei .................. H01L 45/145
257/4
2015/0280120 A1* 10/2015 Molas ................ H01L 45/1266
257/3
(Continued)

FOREIGN PATENT DOCUMENTS

JP       2013016529 A     1/2013
WO    WO-2014087784 A1   6/2014
(Continued)

OTHER PUBLICATIONS

International Search Report and Written Opinion prepared by the Japanese Patent Office dated Feb. 12, 2019, for International Application No. PCT/JP2018/044965.

*Primary Examiner* — Jerome Leboeuf
(74) *Attorney, Agent, or Firm* — Sheridan Ross P.C.

(57) ABSTRACT

A storage device includes a first electrode, a second electrode, and a storage layer. The second electrode is disposed to oppose the first electrode. The storage layer is provided between the first electrode and the second electrode, and includes one or more chalcogen elements selected from tellurium (Te), selenium (Se), and sulfur (S), transition metal, and oxygen. The storage layer has a non-linear resistance characteristic, and the storage layer is caused to be in a low-resistance state by setting an application voltage to
(Continued)

be equal to or higher than a predetermined threshold voltage and is caused to be in a high-resistance state by setting the application voltage to be lower than the predetermined threshold voltage to thereby have a rectification characteristic.

12 Claims, 11 Drawing Sheets

(51) Int. Cl.
*H01L 27/24* (2006.01)
*G11C 13/00* (2006.01)

(52) U.S. Cl.
CPC ........ *G11C 13/004* (2013.01); *H01L 27/2472* (2013.01); *H01L 45/142* (2013.01); *H01L 45/143* (2013.01); *H01L 45/144* (2013.01); *H01L 45/146* (2013.01); *G11C 2213/70* (2013.01)

(58) Field of Classification Search
CPC ............... H01L 45/146; H01L 45/1226; H01L 27/2463; H01L 21/8239; H01L 27/105; H01L 27/249; H01L 45/04; H01L 45/1233; H01L 45/141; G11C 11/5678; G11C 11/5685; G11C 13/004; G11C 2213/70
See application file for complete search history.

(56) References Cited

U.S. PATENT DOCUMENTS

| | | |
|---|---|---|
| 2015/0325628 A1 | 11/2015 | Nonoguchi et al. |
| 2015/0349025 A1* | 12/2015 | Sei ........................ H01L 45/145 257/4 |
| 2015/0357566 A1 | 12/2015 | Wang et al. |
| 2017/0012083 A1 | 1/2017 | Wang et al. |
| 2017/0244028 A1 | 8/2017 | Wang |
| 2018/0047784 A1 | 2/2018 | Ohba |

FOREIGN PATENT DOCUMENTS

| | | | |
|---|---|---|---|
| WO | WO 2014/103577 | 7/2014 | |
| WO | WO-2014103691 A1 * | 7/2014 | ......... H01L 27/2463 |
| WO | WO 2016/111724 | 7/2016 | |
| WO | WO 2016/158429 | 10/2016 | |

* cited by examiner

STORAGE DEVICE AND STORAGE UNIT WITH A CHALCOGEN ELEMENT

CROSS REFERENCE TO RELATED APPLICATIONS

This application is a national stage application under 35 U.S.C. 371 and claims the benefit of PCT Application No. PCT/JP2018/044965, having an international filing date of 6 Dec. 2018, which designated the United States, which PCT application claimed the benefit of Japanese Patent Application No. 2018-010229 filed 25 Jan. 2018, the entire disclosures of each of which are incorporated herein by reference.

TECHNICAL FIELD

The present disclosure relates to: a storage device including a chalcogenide layer between electrodes; and a storage unit including the same.

BACKGROUND ART

In recent years, there has been a demand to increase capacity of data storage non-volatile memories represented by resistance-change memories such as a ReRAM (Resistance Random Access Memory) (registered trademark) or a PRAM (Phase-Change Random Access Memory) (registered trademark). To address this, for example, PTL 1 discloses a cross-point storage unit (a memory cell array) in which memory cells are disposed at respective intersections (cross-points) of intersecting wiring lines. The memory cell has a configuration in which a memory device and a cell-selective switching device are stacked on each other, for example, with an intermediate electrode in between.

CITATION LIST

Patent Literature

PTL 1: International Publication No. WO 2016/158429

SUMMARY OF THE INVENTION

Meanwhile, higher capacity is further demanded in a cross-point memory cell array.

It is desirable to provide a storage device and a storage unit that make it possible to achieve higher capacity.

A storage device according to one embodiment of the present disclosure includes a first electrode, a second electrode, and a storage layer. The second electrode is disposed to oppose the first electrode. The storage layer is provided between the first electrode and the second electrode, and includes one or more chalcogen elements selected from tellurium (Te), selenium (Se), and sulfur (S), transition metal, and oxygen. The storage layer has a non-linear resistance characteristic, and the storage layer is caused to be in a low-resistance state by setting an application voltage to be equal to or higher than a predetermined threshold voltage and is caused to be in a high-resistance state by setting the application voltage to be lower than the predetermined threshold voltage to thereby have a rectification characteristic.

A storage unit according to one embodiment of the present disclosure includes one or more first wiring lines, one or more second wiring lines, and one or more storage devices according to the embodiment of the present disclosure described above. The one or more first wiring lines extend in one direction. The one or more second wiring lines extend in another direction and intersect with the one or more first wiring lines. The one or more storage devices are disposed at respective intersections of the one or more first wiring lines and the one or more second wiring lines.

In each of the storage device according to the embodiment of the present disclosure and the storage unit according to the embodiment of the present disclosure, the storage layer is provided between the first electrode and the second electrode. The storage layer includes: one or more chalcogen elements selected from tellurium (Te), selenium (Se), and sulfur (S); the transition metal; and oxygen. This makes it possible to provide a storage device having a device selection function.

According to each of the storage device according to the embodiment of the present disclosure and the storage unit according to the embodiment of the present disclosure, the storage layer includes: one or more chalcogen elements selected from tellurium (Te), selenium (Se), and sulfur (S); the transition metal; and oxygen. This adds a device selection function to the storage layer. Therefore, fine processing is made easier than in a typical cross-point storage unit. This makes it possible to achieve higher capacity.

It is to be noted that effects described above are not necessarily limiting, and any of effects described herein may be provided.

MODES FOR CARRYING OUT THE INVENTION

Hereinafter, an embodiment of the present disclosure will be described in detail with reference to the drawings. The following description is one specific example of the present disclosure, and the present disclosure should not be limited to the following embodiment. Moreover, the present disclosure is not limited to positions, dimensions, dimension ratios, etc. of respective elements illustrated in each of the drawings. It should be noted that the description is given in the following order.
1. Embodiment
(An example in which a memory layer is formed with use of: one or more chalcogen elements selected from tellurium (Te), selenium (Se), and sulfur (S): a transition metal; and oxygen)
   1-1. Configuration of Memory Device
   1-2. Configuration of Memory Cell Array
   1-3. Workings and Effects
2. Modification Examples (Examples of memory cell arrays each having a three-dimensional structure)
3. Examples

1. Embodiment (1-1. Configuration of Memory Device)

Figure 1:
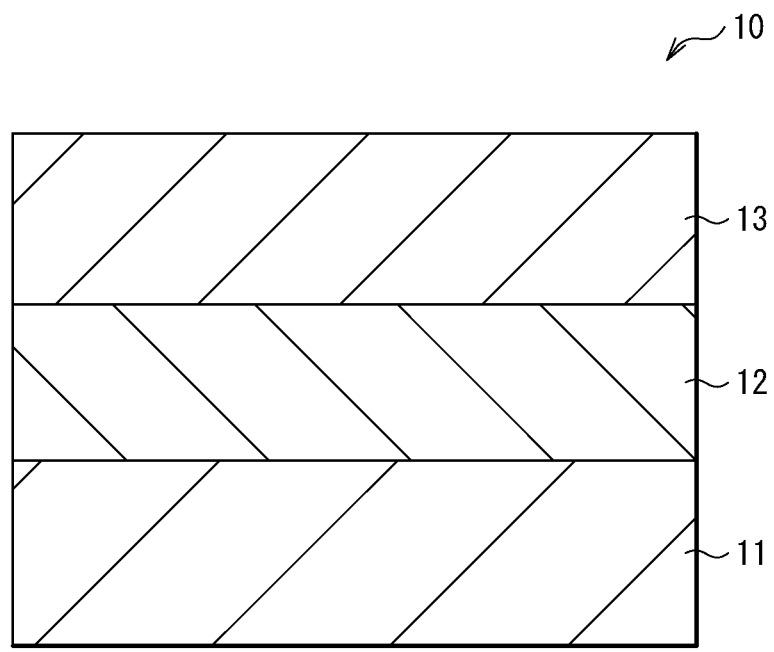
FIG. 1 is a schematic cross-sectional view of an example of a configuration of a memory device according to one embodiment of the present disclosure.

FIG. 1 illustrates an example of a cross-sectional configuration of a storage device (a memory device 10) according to one embodiment of the present disclosure. The memory device 10, for example, selectively causes any of two or more memory cells to operate. The two or more memory cells are disposed in a memory cell array 1 having a so-called cross-point array structure illustrated in FIG. 2. The memory device 10 includes a lower electrode 11 (a first electrode), a storage layer 12, and an upper electrode 13 (a second electrode) in this order. The memory device 10 according to the present embodiment has a configuration in which the storage layer 12 is formed with use of: one or more chalcogen elements selected from tellurium (Te), selenium (Se) and sulfur (S): a transition metal, and oxygen (O).

The lower electrode 11 includes a wiring material for use in semiconductor processing, such as tungsten (W), tungsten nitride (WN), titanium nitride (TiN), copper (Cu), aluminum (Al), molybdenum (Mo), tantalum (Ta), tantalum nitride (TaN), or silicide. In a case where the lower electrode 11 includes a material, such as Cu, that can cause ionic conduction in an electric field, a surface of the lower electrode 11, which includes Cu or the like, may be covered with a material, such as W, WN, titanium nitride (TiN), or TaN, that involves more difficulty in causing ionic conduction or thermal diffusion.

In the storage layer 12, applying a voltage equal to or higher than a predetermined voltage between the lower electrode 11 and the upper electrode 13 switches a resistance state to a low-resistance state and the low-resistance state is recorded. In contrast, applying a predetermined voltage in an opposite direction causes switching from the low-resistance state to a high-resistance state, and the high-resistance state is recorded. Here, the predetermined voltage refers to a voltage at which a predetermined write resistance is obtained. In the storage layer 12, varying the magnitudes of the voltage and the current that are to be applied varies the resistance value to be written.

Furthermore, the storage layer 12 according to the present embodiment has a non-linear resistance characteristic, and further has a rectification characteristic such that increasing an application voltage to be equal to or higher than a predetermined threshold voltage (a switching threshold voltage) causes switching to the low-resistance state and decreasing an application voltage to be lower than the above-described threshold voltage (the switching threshold voltage) causes switching to the high-resistance state. That is, the memory device 10 according to the present embodiment has a device selection function.

The storage layer 12 according to the present embodiment includes a group 16 element in the periodic table, specifically, one or more chalcogen elements selected from tellurium (Te), selenium (Se), and sulfur (S). In the memory device 10 having a strong non-linear resistance characteristic, it is desirable that the storage layer 12 stably maintain its amorphous structure even if a voltage bias for switching is applied. The more stable the amorphous structure is, the more stably it is possible to generate an OTS phenomenon.

The storage layer 12 includes a transition metal element in addition to the above-described chalcogen element. Specifically, it includes one or more of group 4 elements (titanium (Ti), zirconium (Zr), and hafnium (Hf)), group 5 elements (vanadium (V), niobium (Nb), and tantalum (Ta)), and group 6 elements (chromium (Cr), molybdenum (Mo), and tungsten (W)) in the periodic table.

In addition, the storage layer 12 includes oxygen (O). A content of oxygen (O) included in the storage layer 12 is preferably 55 at % or more, for example. At least a portion of the oxygen (O) in the storage layer 12 X is bonded with each of the chalcogen element and the transition metal to form oxides.

The storage layer 12 may include, in addition to the above elements, for example, boron (B), aluminum (Al), gallium (Ga), silicon (Si), and germanium (Ge). Furthermore, the storage layer 12 may include an element other than these elements within a range that does not impair effects of the present disclosure. A film thickness of the storage layer 12 in a stacking direction (hereinafter, simply referred to as a thickness) is, for example, preferably 1 nm or more and 50 nm or less, and is more preferably 1 nm or more and 20 nm or less.

As with the lower electrode 11, a publicly-known semiconductor wiring material can be used for the upper electrode 13; however, a stable material that does not react with the storage layer 12 even through post-annealing is preferable.

The memory device 10 according to the present disclosure has a memory function and a device selection function. Its characteristic will be described with reference to FIG. 7, which will be described later, as one example. In the memory device 10, applying a voltage equal to or higher than a predetermined voltage (a switching threshold voltage (V1)) causes varying to a low-resistance state (LRS1) to carry out writing. Since the memory device 10 has a non-linear resistance, if the application voltage is decreased, for example, upon applying a voltage V/2 bias, which is half of the write voltage, the resistance state is returned to a high-resistance state (LRS2) although writing is being carried out. At that time, applying a read voltage (V2) again without performing erasing operation causes varying to a low-resistance state (LRS3). In contrast, applying the read voltage V2 in the high-resistance state in which writing is not carried out or the erasing operation is carried out causes varying to HRS1. This makes it possible to read the high-resistance state and the low-resistance state with use of a difference of a current at the time when the read voltage V2 is applied.

(1-2. Configuration of Memory Cell Array)

Figure 2:
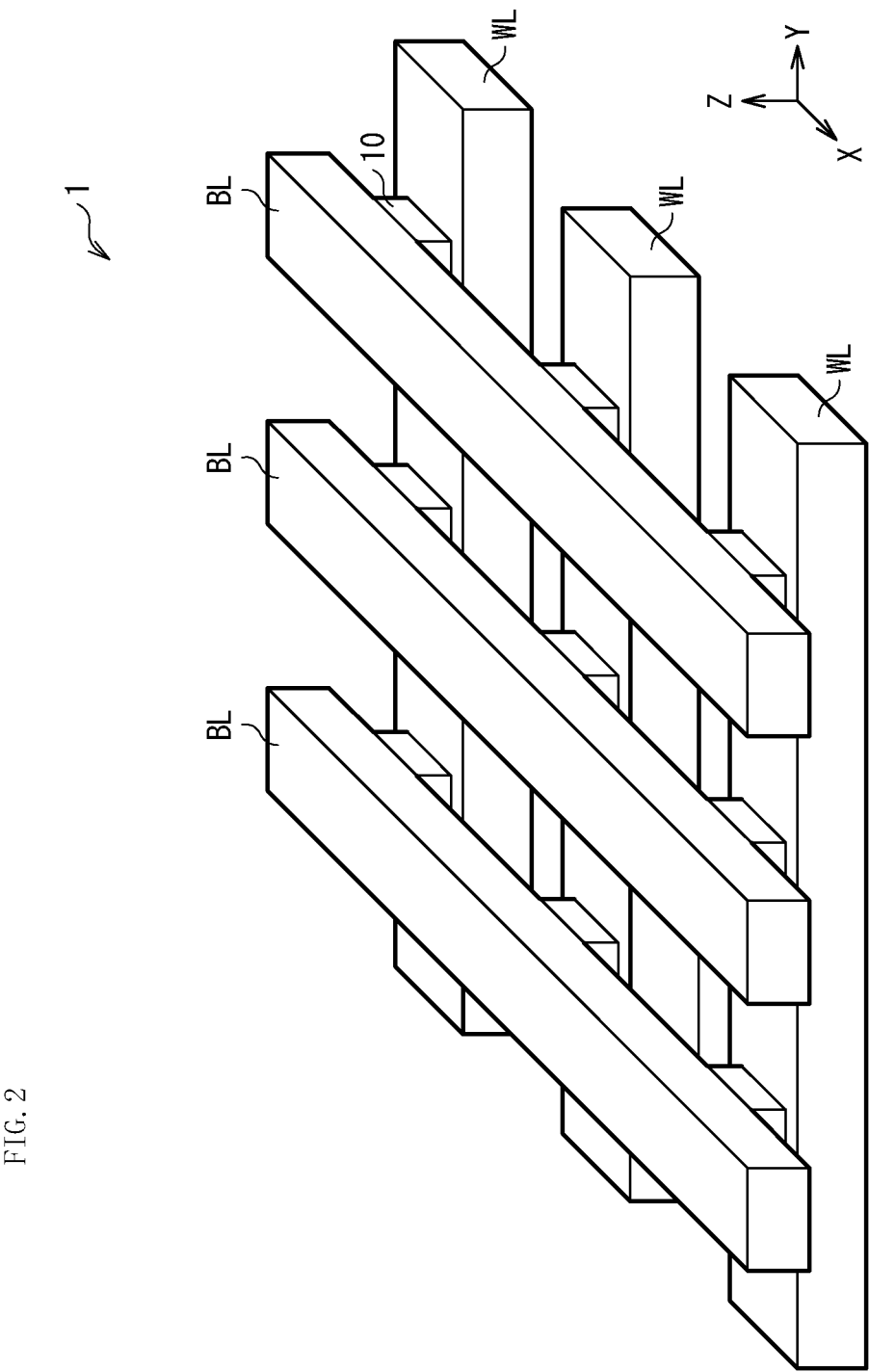
FIG. 2 is a diagram illustrating an example of a schematic configuration of a memory cell array according to one embodiment of the present disclosure.

FIG. 2 is a perspective view of an example of a configuration of the memory cell array 1. The memory cell array 1 corresponds to one specific example of a "storage unit" of the present disclosure. The memory cell array 1 has a so-called cross-point array structure, and, for example, as illustrated in FIG. 2, includes memory cells that are each disposed one by one at a position (a cross-point) at which each of word lines WL and each of bit lines BL oppose each other. In other words, the memory cell array 1 includes two or more word lines WL, two or more bit lines BL, and two or more memory cells that are each disposed one by one at the cross-point. In the memory cell array 1 according to the present embodiment, the memory cell includes the above-described memory device 10, and two or more memory devices 10 are disposed in a plane (two-dimensionally or in an XY plane direction).

Figure 13:
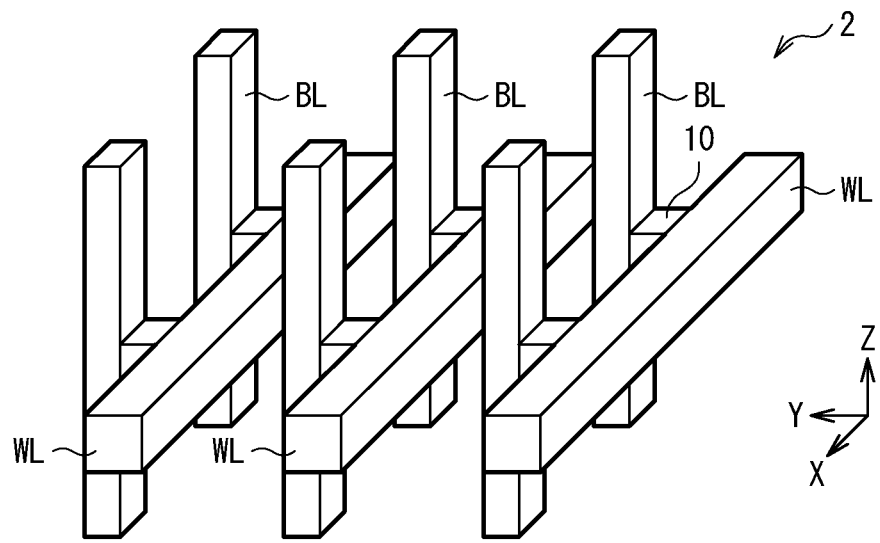
FIG. 13 is a diagram illustrating an example of a schematic configuration of a memory cell array according to a modification example of the present disclosure.

The word lines WL each extend in a common direction. The bit lines BL each extend in a common direction different from the direction in which the word lines WL extend (for example, in a direction orthogonal to the direction in which the word lines WL extend). It should be noted that the two or more word lines WL are disposed in one or more layers, and may be disposed separately in two or more levels as illustrated in FIG. 13, for example. The two or more bit lines BL are disposed in one or more layers, and may be disposed separately in two or more levels as illustrated in FIG. 13, for example.

The memory cell array 1 includes the two or more memory devices 10 that are two-dimensionally disposed on a substrate. The substrate includes, for example; a group of wiring lines electrically coupled to the respective word lines WL and the respective bit lines BL; circuits that couple the group of wiring lines to an external circuit; etc. Each of the word lines WL and each of the bit lines BL may respectively serve as the above-descried lower electrode 11 and the above-descried upper electrode 13, and may be provided separately from the lower electrode 11 and the upper electrode 13. In this case, for example, the lower electrode 11 is electrically coupled to the word lines WL and the upper electrode 13 is electrically coupled to the bit lines BL.

(1-3. Workings and Effects)

As described above, in recent years, there has been a demand to increase capacity of data storage non-volatile memories represented by resistance-change memories such as a ReRAM or a PRAM. However, a 1T1R configuration in which one memory device is disposed for one access transistor increases an area per unit cell and has a limitation in increasing its capacity. To address this, as a method of further increasing the capacity, a cross-point memory having a three-dimensional structure has been considered.

Figure 3:
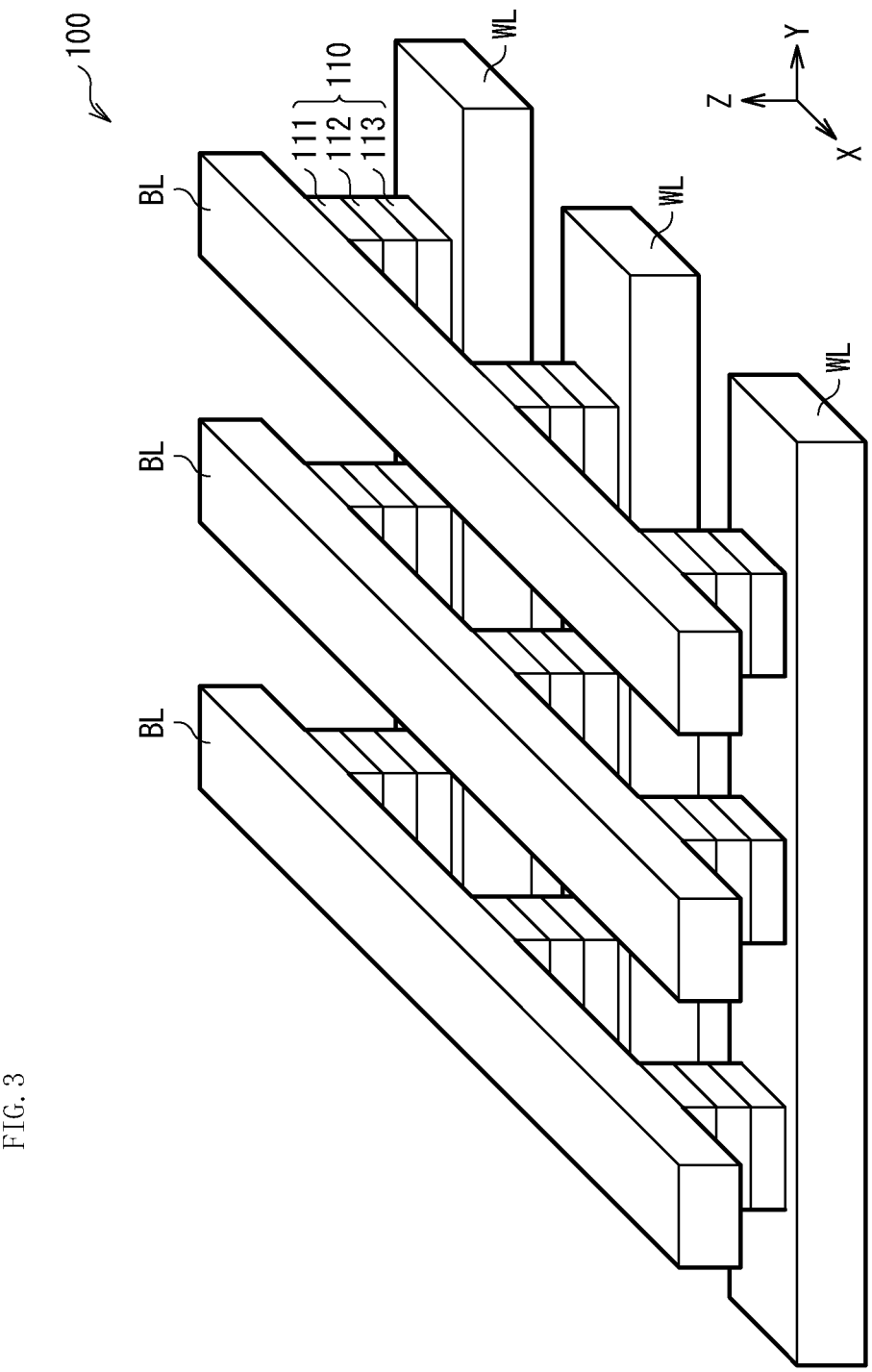
FIG. 3 is a diagram illustrating an example of a schematic configuration of a typical memory cell array.
Figure 4:
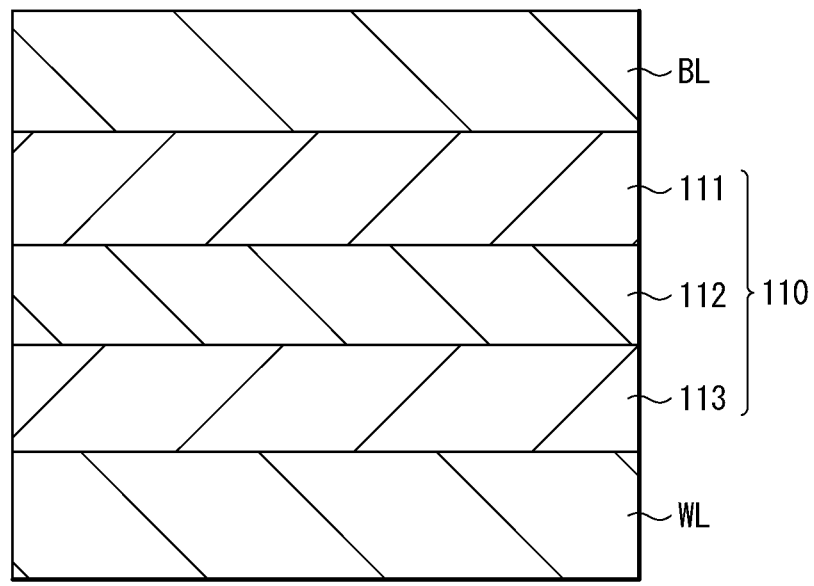
FIG. 4 is a schematic cross-sectional view of a configuration of a memory cell in the memory cell array illustrated in FIG. 3.
Figure 5:
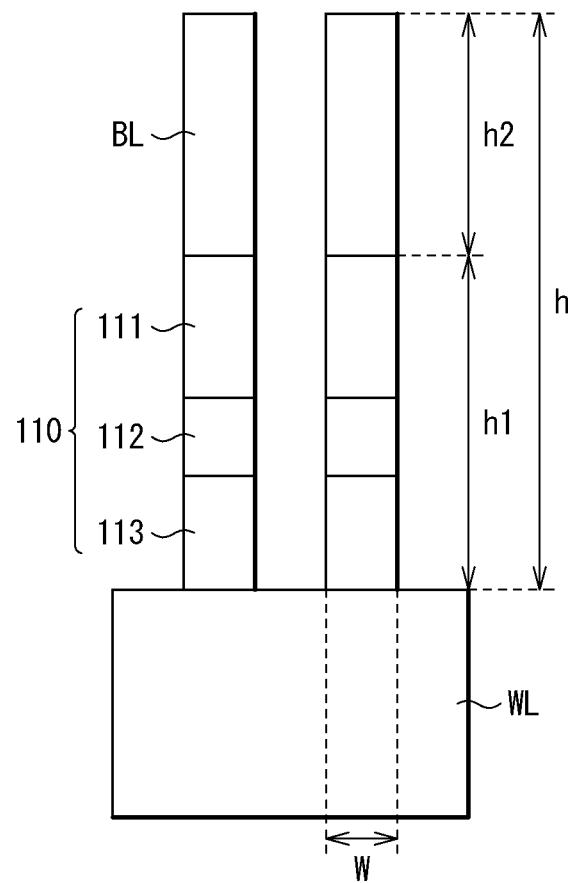
FIG. 5 is a schematic diagram explaining an aspect ratio in the memory cell array illustrated in FIG. 3.

For example, as illustrated in FIG. 3, a typical cross-point memory (a memory cell array 100) has a so-called cross-point array structure in which a memory cell (a memory cell 110) is disposed at a cross-point of intersecting wiring lines. As illustrated in FIGS. 4 and 5, the memory cell 110 has a configuration in which a memory device 111 and a selective device 113 are stacked on each other, for example, with an intermediate electrode 112 in between. It is possible for the cross-point array to have an area of $2F^2$ per unit cell where F is a minimum line width, thus enabling a reduction in the cell area. Moreover, stacking two or more layers upward (for example, in a Z-axis direction) allows the cross-point array to achieve higher capacity.

Miniaturization of the memory cell to achieve higher capacity in the cross-point array poses the following problems. For example, in a ReRAM or a CBRAM (Conductive Bridge RAM) that is a resistance-change memory, or in a PCM (Phase change memory) that is a phase-change memory, a memory device (a memory layer) has a thickness of about 10 nm to about 30 nm. In a typical selective device such as an OTS or an MIT (Metal insulator transition device), the selective device (a selective device layer) has a thickness of at least 20 nm or more, and an Si diode has a thickness of several hundreds nanometers or more. Moreover, an intermediate electrode having a thickness of at least about 20 nm is provided between the memory layer and the selective device layer in order to prevent mutual diffusion of respective layers or for any other purpose. Therefore, the memory cell in the typical cross-point array has a thickness of, for example, 50 nm to 100 nm.

Miniaturization is necessary to increase the capacity of the cross-point array. In a case where the minimum line width is, for example, 20 nm, an aspect ratio between a plane dimension (w) in the total thickness of the memory cell 110 and a height (h1) in the total thickness of the memory cell 110 is, for example, 2.5 to 5 as illustrated in FIG. 5. If the miniaturization is further advanced, and, for example, the minimum line width is 15 nm, the aspect ratio is increased to 3.3 to 6.7, resulting in difficulty in processing the memory cell.

Further, in a case where a memory device such as a ReRAM a CBRAM, or a PCM is used, a current from several tens micro amperes to hundreds micro amperes is used as a rewrite current, and it is required to increase a thickness (h2) of the bit line, the word line, etc. in order to prevent disconnection of the wiring lines. For example, if W is used as a wiring material and driving at a current of 50 µA is to be performed, it is necessary for the W electrode to have a thickness of, for example, about 40 nm. Thus, when the thickness (h) of the memory cell 110 and the thickness (h2) of the electrode layer (e.g., the bit line) are summed (h), the aspect ratio (h/w) at the time of processing is further increased. For example, in a case where the minimum line width is 20 nm, the aspect ratio becomes 4.5 to 7, thus increasing the aspect ratio at the time of processing. Moreover, an area of a peripheral driver circuit is increased due to necessity of increasing dimensions of a transistor of the driver circuit, resulting in a decrease in array efficiency that is a ratio of the memory cell array relative to a memory chip. This makes it difficult to achieve higher capacity even if the miniaturization is achieved.

For these reasons, it is necessary to reduce the thickness of the memory cell and to decrease an operating current in order to achieve higher capacity of the cross-point array.

In contrast, in the memory device 10 according to the present embodiment, the storage layer 12 includes: the one or more chalcogen elements selected from tellurium (Te), selenium (Se), and sulfur (S); the transition metal; and oxygen.

Figure 6:
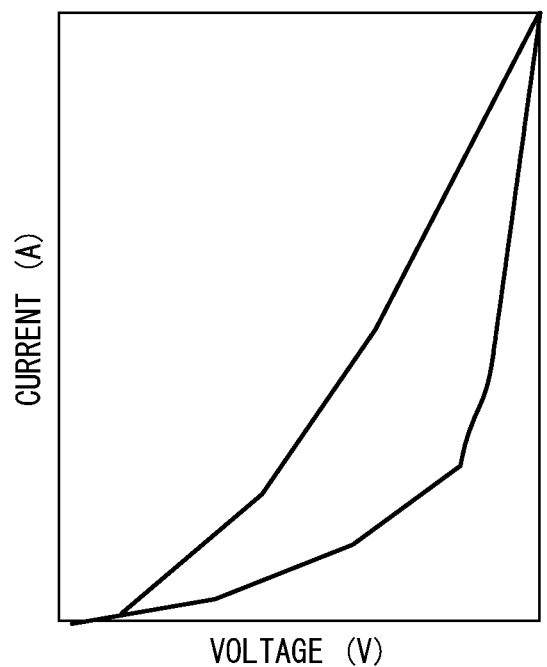
FIG. 6 is a diagram illustrating write current dependency of switching operation in the memory device illustrated in FIG. 1 at the time of high-current writing.
Figure 7:
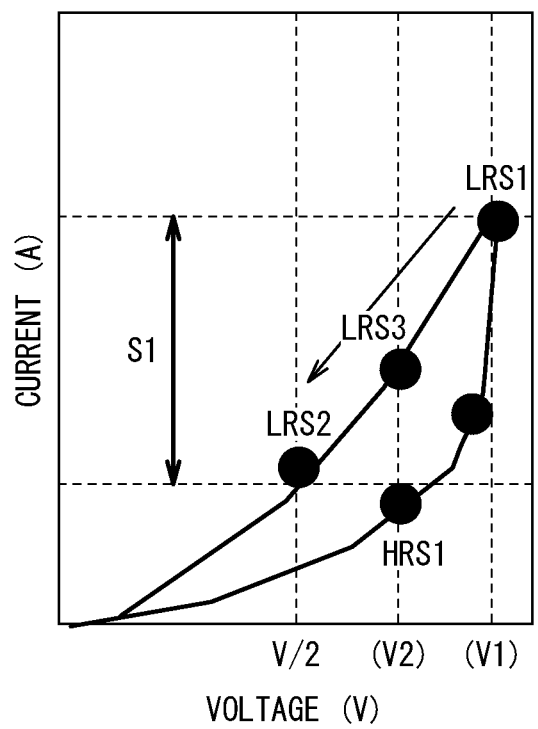
FIG. 7 is a diagram illustrating write current dependency of switching operation in the memory device illustrated in FIG. 1 at the time of intermediate-current writing.
Figure 8:
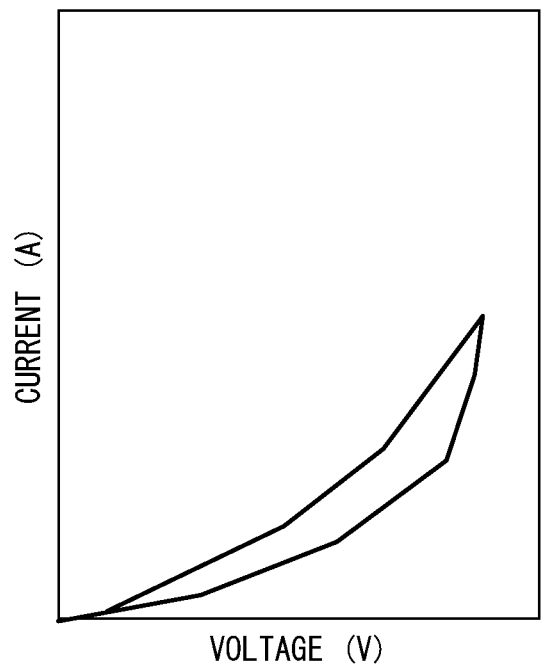
FIG. 8 is a diagram illustrating write current dependency of switching operation in the memory device illustrated in FIG. 1 at the time of low-current writing.
Figure 9:
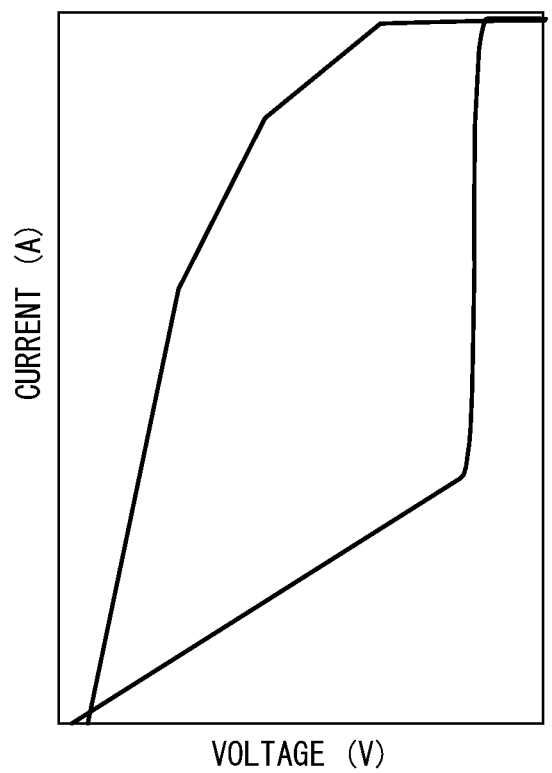
FIG. 9 is a diagram illustrating write current dependency of switching operation in a typical memory device at the time of high-current writing.
Figure 10:
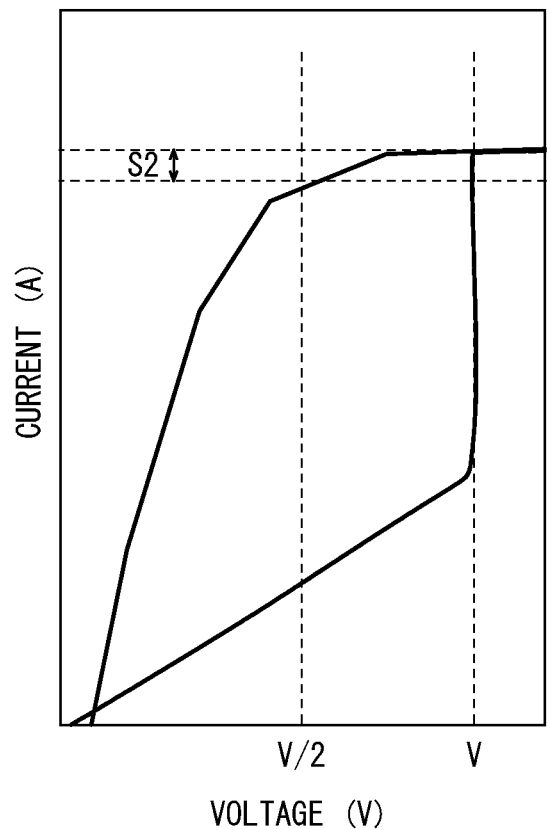
FIG. 10 is a diagram illustrating write current dependency of switching operation in the typical memory device at the time of intermediate-current writing.
Figure 11:
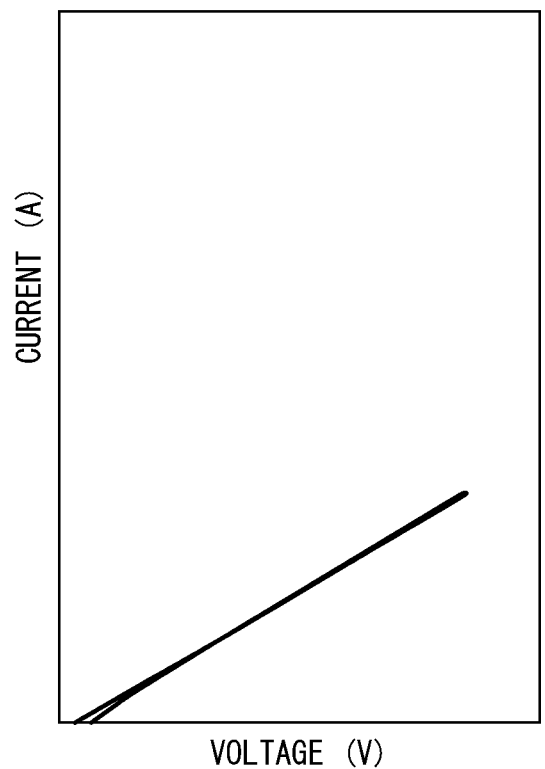
FIG. 11 is a diagram illustrating write current dependency of switching operation in the typical memory device at the time of low-current writing.

FIGS. 6 to 8 illustrate write current dependency of switching operation in the memory device 10 according to the present embodiment. FIG. 6 illustrates write current dependency of the switching operation at the time of high-current writing (for example, several hundreds micro amperes). FIG. 7 illustrates write current dependency of the switching operation at the time of intermediate-current writing (for example, several tens micro amperes). FIG. 8 illustrates write current dependency of the switching operation at the time of low-current writing (for example, several micro amperes). FIGS. 9 to 11 illustrate write current dependency of the switching operation in the memory device 111 illustrated in FIG. 3, FIG. 4, etc. FIG. 9 illustrates write current dependency of the switching operation at the time of high-current writing. FIG. 10 illustrates write current dependency of the switching operation at the time of intermediate-current writing. FIG. 11 illustrates write current dependency of the switching operation at the time of low-current writing.

In the memory device 111, in a case where writing is carried out at a high or intermediate current, the write current is controlled by current limitation through control of a gate voltage of a transistor, etc. Thus, in the case of the example of FIG. 10 in which writing is carried out at an intermediate current, when the voltage is swept to the write voltage, the voltage rises rapidly at a write voltage threshold (V). When the current flowing upon writing is controlled by means of the transistor, and the voltage is thereafter returned to 0 V, the current decreases while a weakly non-linear IV curve is drawn. Therefore, a selection ratio S2, which is necessary for a cross-point memory, between the write voltage (V) and a half select voltage (2/V) is decreased as illustrated in FIG. 10.

In contrast, in the memory device 10 according to the present embodiment, it is possible to control the write current with use of a voltage that is to be applied. For example, in the case of the example of FIG. 7 in which writing is carried out at an intermediate current, when a voltage is applied up to a predetermined write voltage, and the applied current is removed thereafter, the current decreases while a strong non-linear IV curve is drawn. This makes it possible to obtain a larger selection ratio S, which is necessary for a cross-point memory, between the write voltage (V) and the half select voltage (2/V).

As described above, the memory device 10 according to the present embodiment has high non-linearity, thus making it possible to provide a lower leakage current upon half-selection and non-selection. Accordingly, this makes it possible to cause the cross-point array to operate without individually using the memory device and the selective device.

Figure 12:
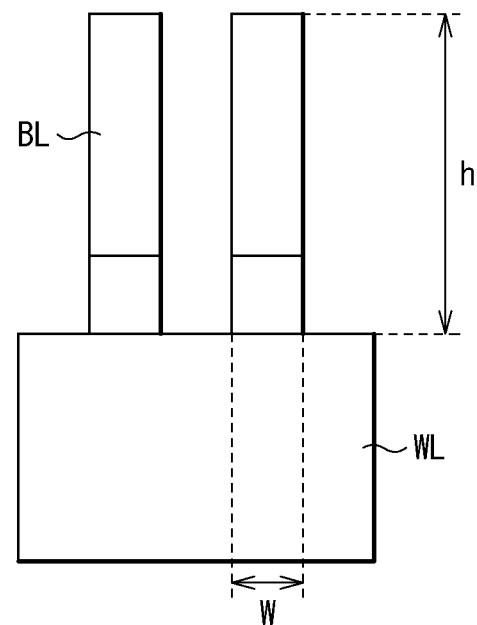
FIG. 12 is a schematic diagram explaining an aspect ratio in the memory cell array illustrated in FIG. 2.

Moreover, in the memory cell array 1 according to the present embodiment, the memory cell is allowed to include only the memory device 10. FIG. 12 is a perspective view of a portion of a cross-sectional configuration of the memory cell array 1. According to the present embodiment, the memory cell is allowed to include only the memory device 10, thus making it possible to reduce the thickness of the memory cell to be processed. In addition, according to the present embodiment, it is possible to cause the memory cell to operate at a current of 1 μA or lower, thus making possible to suppress the current to flow in the bit line BL and the word line WL to be lower. This makes it possible to reduce the thickness of the bit line BL and the thickness of the word line WL. Accordingly, the aspect ratio (h/w) is allowed to be smaller than that of the memory cell 110 in the memory cell array 100 described above. This enables easy processing of the memory cell and fine processing thereof.

Moreover, according to the present embodiment, it is allowed to reduce the operating current for rewriting, thereby making it possible to reduce the size of the transistor in the driver circuit. Thus, it is allowed to increase the area ratio of the memory cell array relative to the chip, thereby making it possible to improve array efficiency.

For these reasons, fine processing is made easier in the memory device 10 and the memory cell array 1 including the memory device 10 according to the present embodiment than in a typical storage unit (for example, the memory cell array 100). This enables achievement of higher capacity.

A description is given of modification examples of the present embodiment described above. Hereinafter, constituent elements similar to those of the forgoing embodiment are denoted by the same reference characters, and a description thereof will be omitted where appropriate.

2. Modification Examples

The memory device 10 according to the above-described embodiment is allowed to be included in a memory cell array having a three-dimensional structure. FIGS. 13 to 16 are perspective views of examples of configurations of memory cell arrays 2 to 5 according to modification examples of the present disclosure, respectively. The memory cell arrays 2 to 5 each have a three-dimensional structure. In the memory cell array having the three-dimensional structure, the word lines WL extend in a direction common to each other. The bit lines BL extend in a direction that is common to each other and is different from the direction in which the word lines WL extend (for example, in a direction orthogonal to the direction in which the word lines WL extend). Moreover, the two or more word lines WL and the two or more bit lines BL are each disposed in any of two or more layers.

In a case where the two or more word lines WL are disposed separately in two or more levels, the two or more bit lines BL are disposed in a layer between a first layer and a second layer. Disposed in the first layer are two or more word lines WL. Disposed in the second layer are two or more word lines WL. The second layer is adjacent to the first layer. In a case where the two or more bit lines BL are disposed separately in two or more levels, the two or more word lines WL are disposed in a layer between a third layer and a fourth layer. Disposed in the third layer are two or more bit lines BL. Disposed in the fourth layer are two or more bit lines BL. The fourth layer is adjacent to the third layer. In a case where the two or more word lines WL are disposed separately in two or more levels and the two or more bit lines BL are disposed separately in two or more levels, the two or more word lines WL and the two or more bit lines BL are alternately disposed in a stacking direction of the memory cell array.

Figure 14:
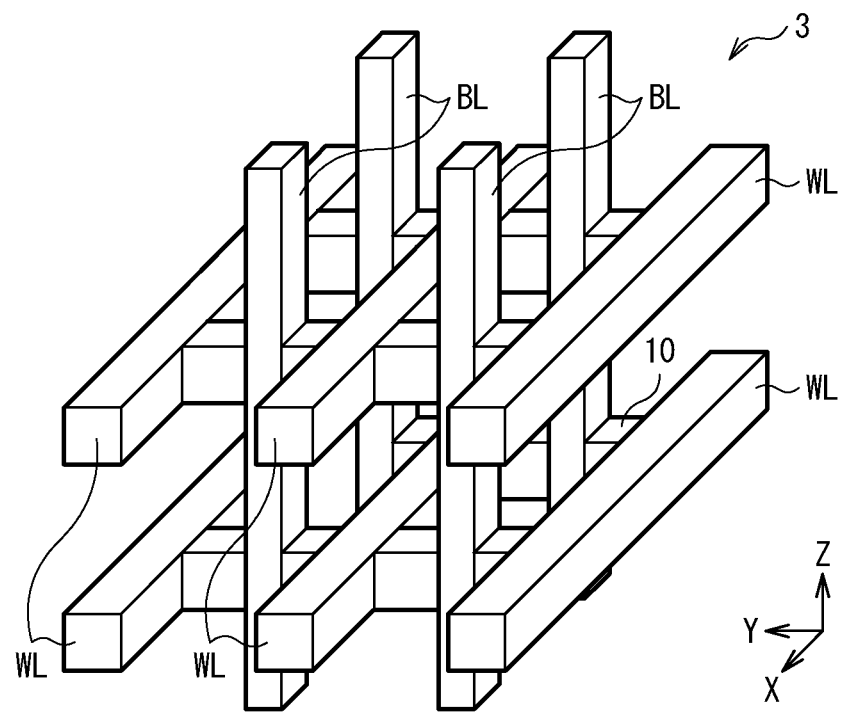
FIG. 14 is a diagram illustrating another example of the schematic configuration of the memory cell array according to the modification example of the present disclosure.
Figure 15:
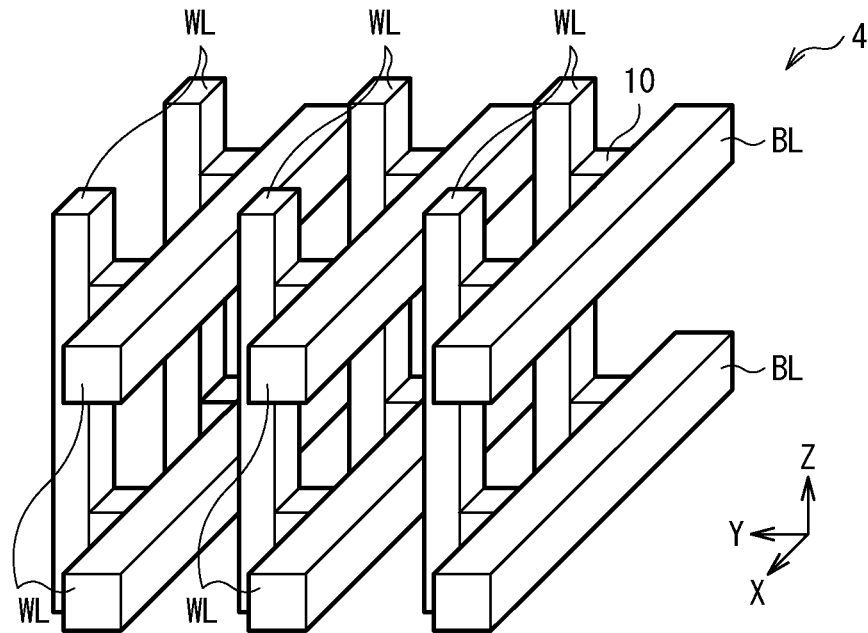
FIG. 15 is a diagram illustrating still another example of the schematic configuration of the memory cell array according to the modification example of the present disclosure.
Figure 16:
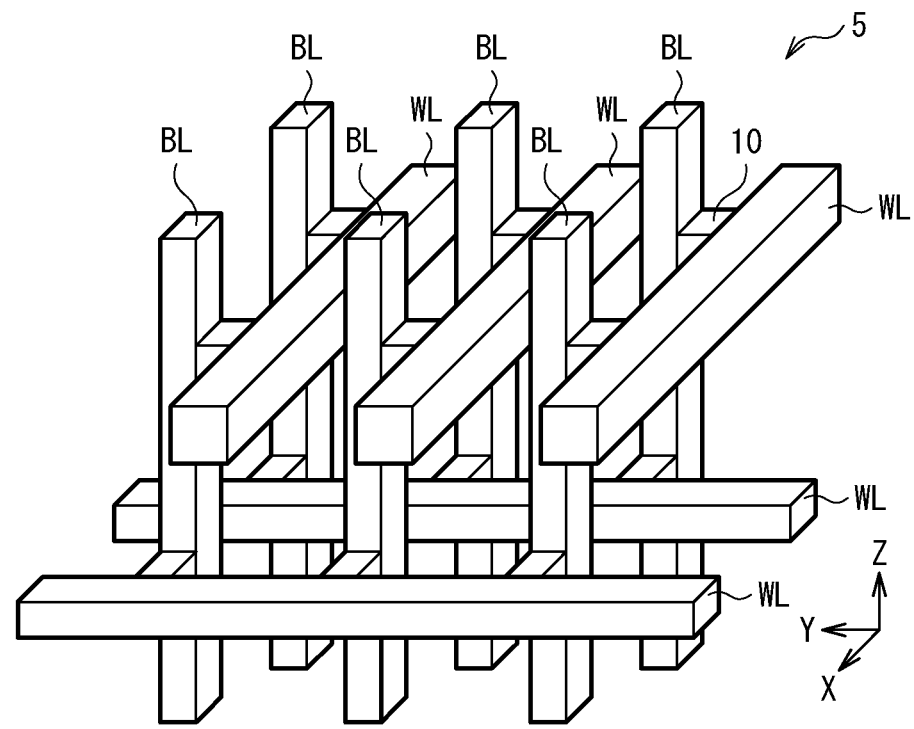
FIG. 16 is a diagram illustrating still another example of the schematic configuration of the memory cell array according to the modification example of the present disclosure.

The memory cell arrays according to the present modification examples each have a vertical cross-point configuration in which either of the word lines WL and the bit lines BL is provided in parallel to the Z-axis direction and the remaining other is provided in parallel to an XY-plane direction. For example, as illustrated in FIG. 13, the memory cell array may have a configuration in which: the two or more word lines WL each extend in an X-axis direction; the two or more bit lines BL each extend in the Z-axis direction; and the memory devices 10 are disposed at respective cross-points of the word lines WL and the bit lines BL. Moreover, as illustrated in FIG. 14, the memory cell array may have a configuration in which the memory devices 10 are disposed on both sides of the cross-points of the two or more word lines WL and the two or more bit lines BL respectively extending in the X-axis direction and the Z-axis direction. Further, as illustrated in FIG. 15, the memory cell array may have a configuration including the two or more bit lines BL extending in the Z-axis direction, and two types of two or more word lines WL extending in respective two directions, namely, the X-axis direction and a Y-axis direction. Furthermore, the two or more word lines WL and the two or more bit lines BL do not necessarily extend in one direction. For example, as illustrated in FIG. 16 in way of example, the two or more bit lines BL may extend in the Z-axis direction, and the two or more word lines WL may extend in the X-axis direction, be bent in the Y-axis direction in the middle, and be bent again in the X-axis direction to extend in a so-called U-shape in the XY plane.

As described above, the memory cell array of the present disclosure has a three-dimensional configuration in which the two or more memory devices 10 are disposed in a plane (two-dimensionally, or in the XY-plane direction) and further stacked in the Z-axis direction. This makes it possible to provide a storage unit having higher density and higher capacity.

3. Examples

Specific Examples of the present disclosure will be described below.

Experiment Example 1

First, a plug-shaped electrode of 160 nmφ formed with TiN was formed as a lower electrode, following which a surface thereof was cleaned by reverse sputtering or the like. Thereafter, an Hf target and a Te target were discharged at the same time by co-sputtering, and reactive sputtering was carried out with use of atmosphere gas in which argon (Ar) and oxygen (O) were mixed at a ratio of 1:1 to form the storage layer. At that time, electric power for layer formation was so adjusted that a composition ratio between Hf and Te was 4:6, and a layer of (Hf70Te30)Ox having a thickness of 10 nm was formed. A composition analysis using RBS (Rutherford backscattering) showed that a composition ratio of oxygen relative to the total of elements other than oxygen was 55%. This will be hereinafter described as (Hf70Te30) O60.

Next, a film of TiN having a thickness of 20 nm was formed as an upper electrode, following which patterning was carried out and device processing was carried out to form the memory cell. Thereafter, an Al wiring electrode was formed, and the formed Al wiring electrode was coupled to a MOS transistor provided on a substrate. Thereafter, the resultant was subjected to heat treatment at 320° C. for 2 hours to fabricate the memory device. This device was used as Experiment example 1, and a IV characteristic thereof was evaluated.

Figure 17:
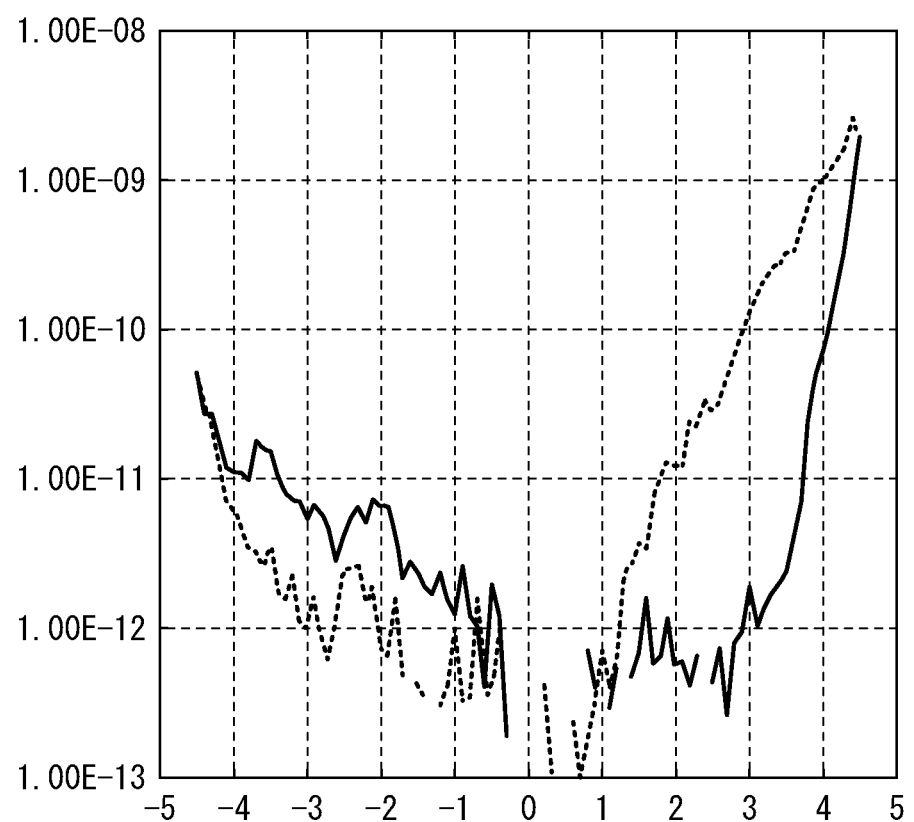
FIG. 17 is a diagram illustrating an IV characteristic of Example 1.

FIG. 17 illustrates an IV curve of Experiment example 1. In Experiment example 1, in a case where the write voltage was set to 4.5 V, it was possible to carry out writing at 3 nA. Moreover, an on/off selection ratio at the time of V/2 bias was 2.03 digits.

Experiment Example 2

In Experiment example 2, the memory device was fabricated in a manner similar to that in Experiment example 1 except that a flow ratio of Ar/O was set to 1:2 to increase the oxygen flow ratio when the storage layer was formed. A composition ratio of oxygen in the storage layer in Experiment example 2 was 65% as a result of an RBS composition analysis.

Experiment Example 3

In Experiment example 3, the memory device was fabricated in a manner similar to that in Experiment example 1 except that a flow ratio of Ar/O was set to 2:1 to increase the oxygen flow ratio when the storage layer was formed. A composition ratio of oxygen in the storage layer in Experiment example 3 was 40% as a result of an RBS composition analysis.

Experiment Example 4

In Experiment example 4, the memory device was fabricated in a manner similar to that in Experiment example 1 except that an input power ratio at the time of layer formation was varied to vary an Hf/Te layer formation rate. A composition ratio of oxygen in the storage layer in Experiment example 3 was 40% as a result of an RBS composition analysis.

Experiment Example 5

In Experiment example 5, the memory device was fabricated in a manner similar to that in Experiment example 1 except that Zr was used in addition to Hf and Te when the storage layer was formed.

Experiment Example 6

In Experiment example 6, the memory device was fabricated in a manner similar to that in Experiment example 1 except that Al was used in addition to Hf and Te when the storage layer was formed.

Experiment Example 7

In Experiment example 7, the memory device was fabricated in a manner similar to that in Experiment example 1 except that B was used in addition to Hf and Te when the storage layer was formed.

Regarding the above-described Experiment examples 2 to 7, characteristic evaluation of the write voltage, the write current, and the selection ratio was conducted as in Experiment example 1. Table 1 is a summary of the characteristic evaluation of Experiment examples 1 to 7.

TABLE 1

|  | Composition of storage layer | Thickness | Write voltage (V) | Write current (nA) | Selection ratio (digit) |
| --- | --- | --- | --- | --- | --- |
| Experiment example 1 | (Hf70Te30)O55 | 10 nm | 4.5 | 3 | 2.0 |

TABLE 1-continued

|  | Composition of storage layer | Thickness | Write voltage (V) | Write current (nA) | Selection ratio (digit) |
|---|---|---|---|---|---|
| Experiment example 2 | (Hf70Te30)O65 | 10 nm | 5 | 2 | 2.2 |
| Experiment example 3 | (Hf70Te30)O40 | 10 nm | 3 | 100 | 1.2 |
| Experiment example 4 | (Hf50Te50)O60 | 10 nm | 3.5 | 10 | 1.9 |
| Experiment example 5 | (Hf50Zr10Te40)O60 | 10 nm | 3 | 16 | 1.7 |
| Experiment example 6 | (Hf60Al10Te30)O55 | 10 nm | 5 | 3 | 2 |
| Experiment example 7 | (Hf60B10Te30)O60 | 10 nm | 4.5 | 5 | 2.2 |

It was found that, in Experiment examples 1 to 3, the higher the oxygen composition ratio was, the more the write voltage increased. However, although not shown here, the increase or decrease in the thickness allowed for adjustment of the write voltage. The greater the thickness was, the higher the write voltage was. The smaller the thickness was, the lower the write voltage was. In addition, even if the memory layers had the same thickness, the higher the oxygen composition ratio was, the lower the write current was. Furthermore, the greater the oxygen content was, the higher the selection ratio was. The selection ratio at 55% oxygen content was two digits, which was favorable. The selection ratio at 40% oxygen content was decreased to 1.2 digits. Moreover, when the selection ratio became small, it was not possible to sufficiently obtain the current ratio between the on state and the off state due to an influence of a leakage current in the cross-point array. It is presumable that this makes it difficult to select the memory cell without any error, resulting in difficulty in causing a larger memory array to operate. Accordingly, it is conceivable that the content of oxygen in a material for a memory according to the present invention is preferably 55% or more.

Further, the ratio between Hf and Te was allowed to be set to not only 70:30 as in Experiment examples 1 to 3, but also 50:50 as described in Experiment example 4. However, in that case, the write current increased whereas the selection ratio was decreased. It was therefore found that the Hf-ratio in the ratio between Hf and Te is preferably more than at least that in the ratio of 30:70.

In Experiment example 5 where Zr was added to Hf Te, and O, it was possible to carry out writing at a low current and to obtain a favorable selection ratio, as in Experiment example 1. Although one kind of element, i.e., Zr was added in Experiment example 5, it can be said that elements other than that such as Ti, V, Nb, Ta, Cr, Mo, or W may be added within a range which does not impair effects of the present disclosure. Moreover, in Experiment examples 6 and 7, Al and B are added respectively in addition to Hf Te, and O, and a low write current and a favorable selection ratio were obtained as in Experiment example 5. Therefore, it is conceivable that the memory device according to the present embodiment may include any of B, Al, Ga, Si, and Ge within a range that does not impair effects of the present disclosure.

Moreover, referring to FIG. 17, resistance change of the memory device 10 according to the present embodiment has a non-linear characteristic, by which it was found that Te was effective as a chalcogen element. On the basis of this, it is presumable that a similar effect is obtainable with Se or S. Accordingly, the material of the storage layer of the memory device according to the present disclosure may include, as a chalcogen element, Se and S in addition to Te. Alternatively, Se or S may be used instead of Te.

Further, in these Examples, the results obtained by formation of the storage layer by means of sputtering were described. However, the method of forming the layer is not limited to this method. For example, the storage layer may be formed by alternate stacking of $HfO_2$ and $TeO_2$ by a method such as ALD.

Furthermore, the thickness of the storage layer in Experiment examples was 10 nm, thereby obtaining a sufficient low write current and a sufficient low off current. However, in terms of the above-described easiness of etching, it is conceivable that the thickness is preferably 20 nm or less.

The present disclosure has been described above with reference to the embodiment and the modification examples. However, the present disclosure is not limited to the foregoing embodiment, etc., and various modifications are possible. For example, as a method of causing the present memory cell array (for example, the memory cell array 1) including the memory device 10 according to the present disclosure to operate, various bias schemes such as publicly-known V-V/2 scheme or V-V/3 scheme may be used.

It is to be noted that the effects described in the specification are mere examples. The effects of the present disclosure are not limited to the effects described in this specification. The contents of the present disclosure may have another effect other than the effects described in the specification.

Moreover, for example, the present disclosure may have any of the following configurations.

(1)

A storage device including:
a first electrode;
a second electrode that is disposed to oppose the first electrode; and
a storage layer that is provided between the first electrode and the second electrode, and includes one or more chalcogen elements selected from tellurium (Te), selenium (Se), and sulfur (S), transition metal, and oxygen, in which
the storage layer has a non-linear resistance characteristic, and the storage layer is caused to be in a low-resistance state by setting an application voltage to be equal to or higher than a predetermined threshold voltage and is caused to be in a high-resistance state by setting the application voltage to be lower than the predetermined threshold voltage to thereby have a rectification characteristic.

(2)

The storage device according to (1) described above, in which the transition metal includes one or more of titanium (Ti), zirconium (Zr), hafnium (Hf), vanadium (V), niobium (Nb), tantalum (Ta), chromium (Cr), molybdenum (Mo), and tungsten (W).

(3)

The storage device according to (1) or (2) described above, in which the storage layer includes 55 atomic percent or more oxygen atoms.

(4)

The storage device according to any one of (1) to (3) described above, in which the storage layer includes tellurium oxide.

(5)

The storage device according to any one of (1) to (4) described above, in which the storage layer includes an oxide of the transition metal.

(6)

The storage device according to any one of (1) to (5) described above, in which the storage layer further includes one or more of boron (B), aluminum (Al), gallium (Ga), silicon (Si), and germanium (Ge).

(7)

The storage device according to any one of (1) to (6) described above, in which a thickness between the first electrode and the second electrode is 20 nanometers or less.

(8)

The storage device according to any one of (1) to (7) described above, in which the storage layer receives application of a voltage between the first electrode and the second electrode to cause a resistance state to be switched at a predetermined voltage or higher to record the low-resistance state, and receives application of a voltage in a direction opposite to that of the predetermined voltage to record the high-resistance state.

(9)

A storage unit including:
one or more first wiring lines that extend in one direction:
one or more second wiring lines that extend in another direction and intersect with the one or more first wiring lines: and
one or more storage devices disposed at respective intersections of the one or more first wiring lines and the one or more second wiring lines,
the one or more storage devices each including
a first electrode,
a second electrode that is disposed to oppose the first electrode, and
a storage layer that is provided between the first electrode and the second electrode, and includes one or more chalcogen elements selected from tellurium (Te), selenium (Se), and sulfur (S), transition metal, and oxygen, in which
the storage layer has a non-linear resistance characteristic, and the storage layer is caused to be in a low-resistance state by setting an application voltage to be equal to or higher than a predetermined threshold voltage and is caused to be in a high-resistance state by setting the application voltage to be lower than the predetermined threshold voltage to thereby have a rectification characteristic.

REFERENCE SIGN LIST

This application claims the benefit of Japanese Priority Patent Application JP2018-010229 filed with the Japan Patent Office on Jan. 25, 2018, the entire contents of which are incorporated herein by reference.

It should be understood by those skilled in the art that various modification, combinations, sub-combinations and alterations may occur depending on design requirements and other factors insofar as they are within the scope of the appended claims or the equivalents thereof.

What is claimed is:

1. A storage device, comprising:
a first electrode;
a second electrode that is disposed to oppose the first electrode; and
a storage layer that is provided between the first electrode and the second electrode, and includes one or more chalcogen elements selected from tellurium (Te), selenium (Se), and sulfur (S), transition metal, and oxygen,
wherein the storage layer has a non-linear resistance characteristic, and the storage layer is caused to be in a low-resistance state by setting an application voltage to be equal to or higher than a predetermined threshold voltage and is caused to be in a high-resistance state by setting the application voltage to be lower than the predetermined threshold voltage to thereby have a rectification characteristic,
wherein the storage layer further includes one or more of aluminum (Al), gallium (Ga) and germanium (Ge), and
wherein the storage layer includes more than 55 atomic percent oxygen atoms.

2. The storage device according to claim 1, wherein the transition metal comprises one or more of titanium (Ti), zirconium (Zr), hafnium (Hf), vanadium (V), niobium (Nb), tantalum (Ta), chromium (Cr), molybdenum (Mo), and tungsten (W).

3. The storage device according to claim 1, wherein the storage layer includes tellurium oxide.

4. The storage device according to claim 1, wherein the storage layer includes an oxide of the transition metal.

5. The storage device according to claim 1, wherein a thickness between the first electrode and the second electrode is 20 nanometers or less.

6. The storage device according to claim 1, wherein the storage layer receives application of a first voltage between the first electrode and the second electrode to cause a resistance state to be switched at a predetermined voltage or higher to record the low-resistance state, and receives application of a second voltage in a direction opposite to that of the predetermined voltage to record the high-resistance state.

7. A storage unit, comprising:
one or more first wiring lines that extend in one direction;
one or more second wiring lines that extend in another direction and intersect with the one or more first wiring lines; and
one or more storage devices disposed at respective intersections of the one or more first wiring lines and the one or more second wiring lines,
the one or more storage devices each including:
a first electrode,
a second electrode that is disposed to oppose the first electrode, and
a storage layer that is provided between the first electrode and the second electrode, and includes one or more chalcogen elements selected from tellurium (Te), selenium (Se), and sulfur (S), transition metal, and oxygen,
wherein the storage layer has a non-linear resistance characteristic, and the storage layer is caused to be in a low-resistance state by setting an application voltage to be equal to or higher than a predetermined threshold voltage and is caused to be in a high-resistance state by setting the application voltage to be lower than the predetermined threshold voltage to thereby have a rectification characteristic, wherein the storage layer further includes one or more of aluminum (Al), gallium (Ga) and germanium (Ge), and wherein the storage layer includes more than 55 atomic percent oxygen atoms.

8. The storage unit according to claim 7, wherein the transition metal comprises one or more of titanium (Ti), zirconium (Zr), hafnium (Hf), vanadium (V), niobium (Nb), tantalum (Ta), chromium (Cr), molybdenum (Mo), and tungsten (W).

9. The storage unit according to claim 7, wherein the storage layer includes tellurium oxide.

10. The storage unit according to claim 7, wherein the storage layer includes an oxide of the transition metal.

11. The storage unit according to claim 7, wherein a thickness between the first electrode and the second electrode is 20 nanometers or less.

12. The storage unit according to claim 7, wherein the storage layer receives application of a first voltage between the first electrode and the second electrode to cause a resistance state to be switched at a predetermined voltage or higher to record the low-resistance state, and receives application of a second voltage in a direction opposite to that of the predetermined voltage to record the high-resistance state.

* * * * *